United States Patent
Uetani et al.

(10) Patent No.: US 6,627,381 B1
(45) Date of Patent: Sep. 30, 2003

(54) CHEMICAL AMPLIFICATION TYPE POSITIVE RESIST COMPOSITION

(75) Inventors: Yasunori Uetani, Toyonaka (JP); Akira Kamabuchi, Ashiya (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/890,803

(22) PCT Filed: Feb. 2, 2000

(86) PCT No.: PCT/JP00/00547

§ 371 (c)(1),
(2), (4) Date: Oct. 25, 2001

(87) PCT Pub. No.: WO00/46640

PCT Pub. Date: Aug. 10, 2000

(51) Int. Cl.$^7$ .............................................. G03F 7/004
(52) U.S. Cl. .................................................. 430/270.1
(58) Field of Search ...................................... 430/270.1

(56) References Cited

U.S. PATENT DOCUMENTS 5,851,727 A    12/1998  Choi et al.
6,506,534 B1 *  1/2003  Nozaki et al. ............ 430/270.1

FOREIGN PATENT DOCUMENTS

| EP | A789279 | 8/1997 | |
|---|---|---|---|
| JP | A8101508 | 4/1996 | |
| JP | A1130865 | 2/1999 | |
| JP | A11109632 | 4/1999 | |
| JP | 2002-23370 A * | 1/2002 | ............ G03F/7/039 |

OTHER PUBLICATIONS

English language machine translation of JP–2002–23370.*

* cited by examiner

Primary Examiner—Janet Baxter
Assistant Examiner—Amanda C. Walke
(74) Attorney, Agent, or Firm—Birch, Stewart, Kolasch & Birch, LLP

(57) ABSTRACT

A chemical amplification type positive resist composition comprising: a resin which has a hydroxystyrene-based polymerization unit, a 3-hydroxy-1-adamantyl methacrylate-based polymerization unit and a polymerization unit having a group unstable toward an acid, and, though insoluble or hardly soluble in an alkali in itself, becomes alkali-soluble after the acid-unstable group has been cleaved by the action of an acid; and an acid generating agent is provided. This resist composition is improved in exposure latitude and resolution. Moreover, such properties as sensitivity, heat resistance, the ratio of residual thickness, coatability, and dry etching resistance are also maintained good. Thus, through the use of this composition, a fine resist pattern can be formed with high precision.

8 Claims, No Drawings

CHEMICAL AMPLIFICATION TYPE POSITIVE RESIST COMPOSITION

TECHNICAL FIELD

The present invention relates to a resist composition suitable for lithography by the action of such high-energy rays as far ultraviolet rays (including excimer laser and others), electron beam, X-ray or other rays.

BACKGROUND TECHNOLOGY

With an increasing demand for higher integration of integrated circuits in recent years, formation of submicron patterns has been required. Particularly, since lithography with the use of krypton fluoride (KrF) excimer laser or argon fluoride (ArF) excimer laser makes the production of integrated circuits of 64 M DRAM to 1 G DRAM possible, the lithographic process is drawing attention. As a resist suitable for the above-mentioned excimer laser lithographic process, so-called a chemical amplification type resist utilizing an acid catalyst and the chemical amplification effect has been increasingly adopted. In the chemical amplification type resist, an acid generated from an acid generating agent at areas irradiated with a ray is diffused in the following heat treatment (post exposure bake: hereinafter sometimes abbreviated as PEB) and a reaction catalyzed by this acid changes the solubility of the exposed areas in an alkaline developer, providing positive or negative patterns.

For a positive resist of the chemical amplification type, particularly a positive resist for KrF excimer laser lithography, a poly(hydroxystyrene) resin with part of its phenolic hydroxyl group protected by a group which undergoes cleavage by the action of an acid is employed, in many cases in combination with an acid generating agent. As the group which undergoes cleavage by the action of an acid, from the viewpoints of resolution, sensitivity, and others, those forming acetal-type bonds with oxygen atoms derived from phenolic hydroxyl groups, such as resins having a structure in which tetrahydro-2-pyranyl, tetrahydro-2-furyl, or 1-ethoxyethyl is bound to an oxygen atom, are arousing interest. However, even the use of such resins has been faced with limitations in improvement in resolution.

Moreover, in the formation of a pattern by photolithography, generally, variations in exposure dose are liable to lead to variations in the finished dimensions of the resulting resist pattern, indicating its small exposure latitude (also referred to as exposure margin). As described above, resist compositions conventionally known in the art have limits in resolution, sensitivity, exposure capacity, and others. Furthermore, since the manufacture of integrated circuits involves dry etching through a resist pattern formed by photolithography as a mask, the resist employed therefor is also required to have heat resistance and dry etching resistance.

DISCLOSURE OF INVENTION

The object of the present invention is to provide a chemical amplification type positive resist composition excellent in such properties as sensitivity, resolution, heat resistance, the ratio of residual thickness, coatability, exposure latitude, dry etching resistance, and others, particularly one that is further improved in resolution and exposure latitude.

The inventors of the present invention made intensive studies to achieve the above-mentioned object and have found that the use of a hydroxystyrene/3-hydroxy-1-adamanty methacrylate copolymer as a resin component for the chemical amplification type positive resist provides excellent performance. The present invention was accomplished based on this finding.

Accordingly, the present invention provides a chemical amplification type positive resist composition containing: a resin which has a hydroxystyrene-based polymerization unit, a 3-hydroxy-1-adamantyl methacrylate-based polymerization unit, and a polymerization unit having a group unstable toward an acid, and, though insoluble or hardly soluble in an alkali in itself, becomes alkali-soluble after the acid-unstable group described above has been cleaved by the action of an acid; and an acid generating agent.

Although the resin component which is a main constituent of the resist composition of the present invention is insoluble or hardly soluble in an alkali in itself, it is rendered alkali-soluble through a reaction by the action of an acid, and has a polymerization unit resulting from the opening of the double bond of the vinyl group of hydroxystyrene, and a polymerization unit which results from the opening of the double bond of the vinyl group of 3-hydroxy-1-adamantyl methacrylate, as essential constituents. These polymerization units can be represented by the following formulae (I) and (II), respectively.

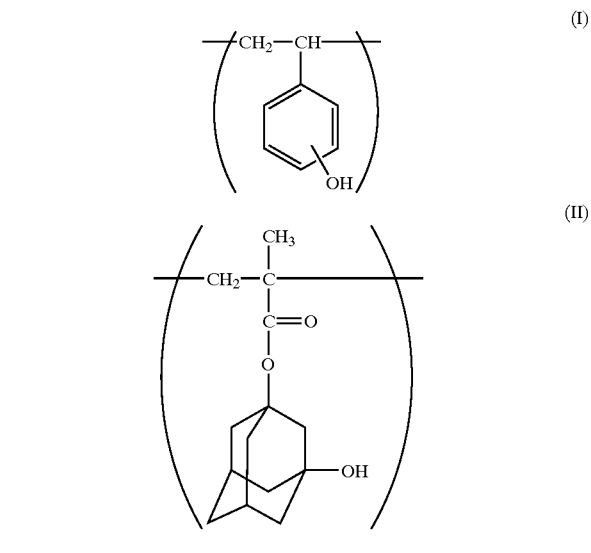

In the polymerization unit formed from hydroxystyrene shown by the formula (I), the position of the hydroxyl group is not particularly restricted, but the polymerization unit is generally one that is formed from p-hydroxystyrene.

Moreover, this resin is insoluble or hardly soluble in an alkali in itself. However, for becoming alkali-soluble through a chemical reaction by the action of an acid, it comprises a polymerization unit having a group unstable toward an acid. Usually, the group unstable toward an acid has been introduced to the resin so as to protect such an alkali-soluble group as hydroxyl group and carboxyl group. Concrete examples of such acid-unstable group for protecting an alkali-soluble group include tert-butyl, tert-butoxycarbonyl, an acetal-type group of the following formula (III):

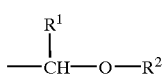

(III)

wherein, $R^1$ represents for an alkyl group having 1 to 4 carbon atoms, $R^2$ represents an alkyl group having 1 to 6 carbon atoms or a cycloalkyl group having 5 to 7 carbon atoms, or $R^1$ and $R^2$ together form a trimethylene or tetramethylene chain, and a 2-alkyl-2-adamantyl represented by the following formula (IV):

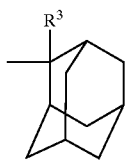

(IV)

wherein, $R^3$ represents an alkyl group having 1 to 4 carbon atoms. These groups each substitutes for the hydrogen atom of the hydroxyl or carboxyl group.

Those suitable as the acetal-type group represented by the formula (III) include tetrahydro-2-furyl, tetrahydro-2-pyranyl, 1-ethoxyethyl, 1-isopropoxyethyl, 1-isobutoxyethyl, 1-ethoxypropyl, 1-ethoxy-2-methylpropyl, and 1-cyclohexyloxyethyl. Of these, 1-ethoxyethyl, 1-isobutoxyethyl, 1-isopropoxyethyl, 1-ethoxypropyl, and others are preferred. Moreover, examples of suitable 2-alkyl-2-adamantyl groups represented by the formula (IV) are 2-methyl-2-adamantyl and 2-ethyl-2-adamantyl.

Among the groups unstable toward an acid enumerated above, tert-butoxycarbonyl usually substitutes for hydroxyl group and a 2-alkyl-2-adamantyl group represented by the formula (IV) usually substitutes for carboxyl group. Other tert-butyl and acetal-type groups represented by the formula (III) can substitute for both hydroxyl group and carboxyl group.

In the case of a resist for KrF excimer laser exposure, the group unstable toward an acid is generally such as to protect the hydroxyl group of a hydroxystyrene unit. A unit in which the acid-unstable group is bound to the hydroxyl group of a hydroxylstyrene unit can be represented by the following formula (V):

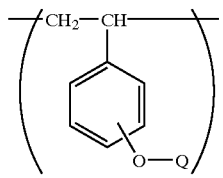

(V)

In the formula, Q represents the acid-unstable group. Tert-butyl, tert-butoxycarbonyl, acetal-type groups represented by the formula (III) shown above, and the like are mentioned as concrete examples of Q in this formula. Among these, the acetal-type groups represented by the above-shown formula (III) are preferred. Its preferred embodiment as a polymerization unit can be represented by the following formula

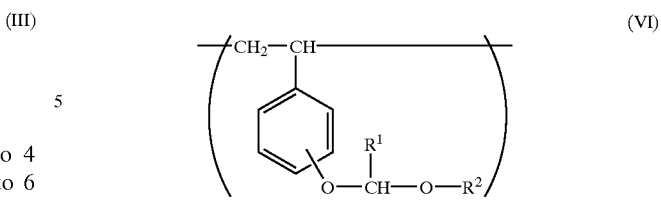

(VI)

wherein, $R^1$ and $R^2$ have the same meanings as defined in the formula (III). A particularly preferred is the case where $R^1$ in the formula (III) or (VI) is an alkyl group having 1 to 4 carbon atoms and $R^2$ is an alkyl group having 1 to 6 carbon atoms or a cycloalkyl having 5 to 7 carbon atoms.

The resin having a hydroxystyrene-based polymerization unit, a 3-hydroxy-1-adamantyl methacrylate-based polymerization unit, and such a polymerization unit having a group unstable toward an acid as was described above can be produced, for example, in the following manner. Firstly, in the case where tert-butyl serves as the acid-unstable group and substitutes for the hydroxyl group of hydroxystyrene, the resin can be produced by, after tert-butoxystyrene and 3-hydroxy-1-adamantyl methacrylate have been copolymerized in a conventional manner, hydrolyzing the resulting copolymer to an appropriate degree thereby to convert part of the tert-butoxy group to hydroxyl group. Moreover, when the group unstable toward an acid is tert-butoxycarbonyl and substitutes for the hydroxyl group of hydroxystyrene, the resin can be produced by allowing the copolymer of hydroxystyrene and 3-hydroxy-1-adamantyl methacrylate to react with di-tert-butyl dicarbonate.

Secondly, in the case where the group unstable toward an acid is an acetal-type group of the formula (III) and substitutes for the hydroxyl group of hydroxystyrene, the resin can be produced by allowing the copolymer of hydroxystyrene and 3-hydroxy-1-adamantyl methacrylate to react with an unsaturated ether compound represented by the following formula (IIIa):

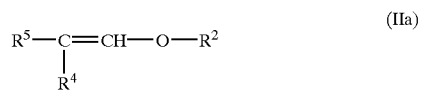

(IIa)

wherein, $R^2$ has the same meaning as defined above; $R^4$ and $R^5$ each independently represents hydrogen or an alkyl group with the proviso that the number of carbon atoms in total is from 0 to 3 or $R^5$ represents hydrogen; and $R^2$ and $R^4$ together form a trimethylene or tetramethylene chain.

On the other hand, in the case where the group which is unstable toward an acid is tert-butyl, an acetal type group represented by the formula (III), or a 2-alkyl-2-adamantyl group represented by the formula (IV) and substitutes for carboxyl group, usually, the resin can be produced by copolymerizing an unsaturated compound constituting a carboxylate with any of these groups, with hydroxystyrene and 3-hydroxy-1-adamantyl methacrylate. As the unsaturated compound constituting a carboxylate with a group unstable toward an acid, there are exemplified unsaturated aliphatic carboxylates such as acrylates and methacrylates and unsaturated alicyclic carboxylates such as norbornene carboxylate, tricyclodecene carboxylate, and tetracyclodecene carboxylate.

Copolymerization of hydroxystyrene or tert-butoxystyrene with 3-hydroxy-1-adamantyl methacrylate, and, if required, a monomer having a group unstable toward an acid and/or other monomers can be effected in accordance with a conventional manner. For example, a method comprising dissolving monomers as starting materials in an appropriate solvent, adding a polymerization initiator thereto to cause a polymerization reaction, and keeping the reaction proceeding while heating or removing heat therefrom can be adopted. As the reaction solvent, there can be employed an alcohol such as methanol, ethanol, 2-propanol, and tert-butanol, an aromatic hydrocarbon such as benzene, toluene, and xylene, or an ether such as tetrahydrofuran and 1,4-dioxane. Moreover, as the polymerization initiator, there can be used an azo compound such as 2,2'-azobis (isobutylonitrile) and dimethyl2,2'-azobis(2-methylpropionate), a peroxide such as benzoyl peroxide and tert-butyl peroxide, a redox catalyst such as hydrogen peroxide/ferrous salt and benzoyl peroxide/dimethylaniline, or a metal alkyl compound such as butyllithium and triethylaluminium.

In the case where tert-butoxystyrene is employed as a starting material monomer, the copolymer is dissolved in a hydrophilic solvent and heated under acidic conditions, whereby the tert-butoxy group contained therein is hydrolyzed to be converted to a hydroxyl group and the copolymer becomes a hydroxystyrene/3-hydroxy-1-adamantyl methacrylate copolymer. Moreover, when introducing a group which is unstable toward an acid to the hydroxystyrene/3-hydroxy-1-adamantyl methacrylate copolymer, following such a procedure as to accord to an ordinary protective group-introducing reaction will be sufficient. For example, in the case where an acetal-type group expressed by the formula (III) shown above is introduced, part of the hydroxyl group in the copolymer can be converted to an acetal-type group represented by the formula (III) by dissolving the copolymer as a starting material in a solvent and allowing it to react with an unsaturated ether compound represented by the formula (IIIa) in the presence of an acidic catalyst. As the acidic catalyst employed in this reaction, inorganic acids such as hydrochloric acid and sulfuric acid and organic acids such as p-toluenesulfonic acid and camphorsulfonic acid are available.

As to the resin component which constitutes the positive resin composition of the present invention, hydroxystyrene-based polymerization unit, 3-hydroxy-1-adamantyl methacrylate-based polymerization unit, and polymerization unit having a group unstable toward an acid as were described above are essential. Further, it may contain other polymerization units, such as styrene, acrylonitrile, methyl methacrylate, and methyl acrylate. Further, for improving the transparency, it may be partially hydrogenated, or an alkyl group, an alkoxy group, or the like may be introduced to the phenol ring with the proviso the resin composition remains alkali-soluble. However, that the hydroxystyrene-based polymerization units and 3-hydroxy-1-adamantyl methacrylate polymerization units account for, in total, 50 mol % or more of the all polymerization units of the resin will be advantageous. The ratio of these polymerization units is, in terms of the molar ratio of hydroxystyrene unit:3-hydroxy-1-adamantyl methacrylate unit, usually in the range of from 99:1 to 80:20, preferably in the range of from 95:5 to 85:15. Moreover, the polymerization units having a group unstable toward to an acid usually account for 50 mol % or less of all the polymerization units of the resin, preferably not less than 10 mol % nor more than 45 mol %.

Incidentally, in the case where the hydroxystyrene/3-hydroxy-1-adamantyl methacrylate copolymer is reacted with a compound which is for introducing an acid-unstable group, such as di-tert-butyl dicarbonate or an unsaturated ether compound represented by the above-shown formula (IIIa), a protective group may be introduced not only to the hydroxyl group of the hydroxystyrene unit but also to the hydroxyl group of the 3-hydroxy-1-admantyl methacrylate unit. In the case of the presence of such a unit in which the hydroxyl group of 3-hydroxy-1-adamantyl methacrylate is protected by a group unstable toward an acid, considering it to be categorized as a polymerization unit having an unstable group is rational.

Next, the acid generating agent which is the other constituent of the positive resist composition generates an acid upon decomposition caused by allowing a ray exemplified by light or electron beam to act on the substance itself or a resist composition containing this substance. The acid generated from the acid generating agent acts on the above-described resin, resulting in the cleavage of the acid-unstable group existing in this resin. Examples of such acid generating agent include onium salt compounds, s-triazine type organic halogen compounds, sulfonic compounds, and sulfonates. To be concrete, the following compounds are exemplified as the acid generating agent.

Diphenyliodonium trifluoromethanesulfonate, 4-methoxyphenylphenyliodonium hexafluoroantimonate, 4-methoxyphenylphenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluromethanesulfonate, triphenylsulfonium hexafluorophosphate, triphenylsulfonium hexafluoroantimonate, triphenylsulfonium trifluromethanesulfonate, 4-methylphenyldiphenylsulfonium perfluorobutanesulfonate, 4-methylphenyldiphenylsulfonium perfluorooctanesulfonate, 4-methoxyphenyldiphenylsulfonium hexafluoroantimonate, 4-methoxyphenyldiphenylsulfonium trifluoromethanesulfonate, p-tolyldiphenylsulfonium trifluoromethanesulfonate, 2,4,6-trimethylphenyldiphenylsulfonium trifluoromethanesulfonate, 4-tert-butylphenyldiphenylsulfonium trifluoromethanesulfonate, 4-phenylthiophenyldiphenylsulfonium hexafluorophosphate, 4-phenylthiophenyldiphenylsulfonium hexafluoroantimonate, 1-(2-naphthoylmethyl)thiolanium hexafluoroantimonate, 1-(2-naphthoylmethyl)thiolanium trifluoromethanesulfonate, 4-hydroxy-1-naphthyldimethylsulfonium hexafluoroantimonate, 4-hydroxy-1-naphthyldimethylsulfonium trifluoromethanesulfonate, 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolan-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, 2-(4-pentyloxystyryl)-4,6-bis(trichloromethyl)-1,3,5-triazine, 1-benzoyl-1-phenylmethyl p-toluenesulfonate (what is called benzointosylate), 2-benzoyl-2-hydroxy-2-phenylethyl p-toluenesulfonate (what is called α-methylolbenzointosylate), 1,2,3-benzenetoluyl trismethanesulfonate, 2,6-dinitrobenzyl p-toluenesulfonate, 2-nitrobenzyl p-toluenesulfonate, 4-nitrobenzyl p-toluenesulfonate, diphenyl disulfone, di-p-tolyl disulfone, bis(phenylsulfonyl)diazomethane, bis(4-chlorophenylsulfonyl)diazomethane, bis(p-tolylsulfonyl) diazomethane, bis(4-tert-butylphenylsulfonyl) diazomethane, bis(2,4-xylylsulfonyl)diazomethane, bis (cyclohexylsulfonyl)diazomethane, (benzoyl) (phenylsulfonyl)diazomethane, N-(phenylsulfonyloxy) succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxy imide, N-(trifluoromethylsulfonyloxy) naphthalimide, and N-(10-camphorsulfonyloxy) naphthalimide.

Moreover, generally in the chemical amplification type positive resist, it has been known that the addition of an organic basic compound as a quencher improves the degree of deterioration in performance due to the deactivation resulting from standing after exposure to light. It is preferred that, also in the present invention, an organic basic compound, particularly a nitrogen-containing basic organic compound is blended thereinto as a quencher. Concrete examples of such nitrogen-containing basic organic compound include amines represented by the following respective formulae.

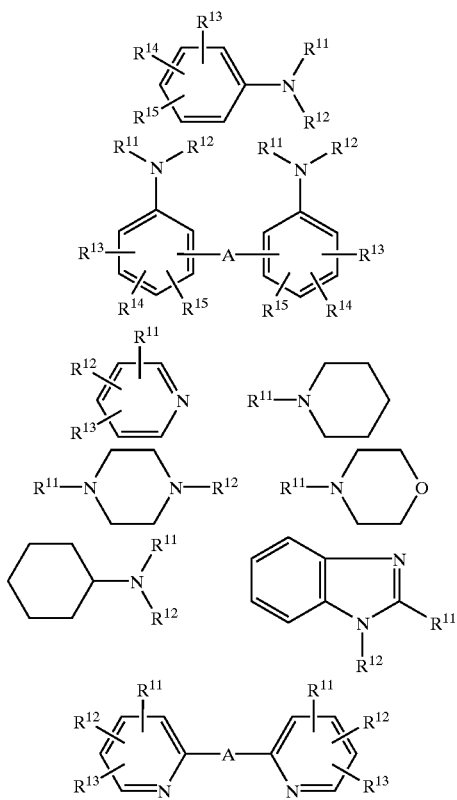

wherein, $R^{11}$, $R^{12}$, $R^{13}$, $R^{14}$, and $R^{15}$ each independently represents hydrogen, or an alkyl, cycloalkyl, aryl or alkoxy group which may be substituted by a hydroxyl group, and A represents an alkylene, carbonyl, or imino group. In the formulae, the alkyl and alkoxy groups represented by $R^{11}$ to $R^{15}$ each may have about 1 to 6 carbon atoms, and the cycloalkyl group may have about 5 to 10 carbon atoms, and the aryl group may have about 6 to 10 carbon atoms. Moreover, the alkylene group denoted by A may have about 1 to 6 carbon atoms and may be a straight or branched chain. Furthermore, the hindered amine compound having a hindered piperidine skeleton, disclosed in Japanese Patent Application No. 9-208864 which is the application previously filed by the applicants of the present invention, also can serve as the quencher.

The resist composition of the present invention is preferred to contain, based on the total solid content, 80 to 99.8% by weight of the resin component and 0.1 to 20% by weight of the acid generating agent. In the case where a nitrogen-containing basic organic compound is incorporated therein as a quencher, it is preferably used in an amount of, based on the total solid content in the resin composition, 10% by weight or less. This composition may contain, if necessary, a variety of additives such as sensitizers, dissolution inhibitors, other resins, surfactants, stabilizers, and dyes in small amounts.

This resist composition is usually in the form of a resist solution in which the above-mentioned components are dissolved in a solvent, and coated on a substrate such as a silicone wafer by a conventional manner such as spin coating. The solvent to be employed need only be capable of dissolving each component, have an appropriate drying rate, and be able to provide a uniform and smooth coat after it has been evaporated off. Such a solvent as is commonly employed in the art can be used. For example, there are mentioned glycol ether esters such as ethyl cellosolve acetate, methyl cellosolve acetate, and propylene glycol monomethyl ether acetate, esters such as ethyl lactate, butyl acetate, amyl acetate, and ethyl pyruvate, ketones such as acetone, methyl isobutyl ketone, 2-heptanone, and cyclohexanone, cyclic esters such as γ-butyrolactone, and alcohols such as 3-methoxy-1-butanol. These solvents can be used either singly or as a combination of two or more.

The resist film coated and dried on the substrate is exposed to light for patterning. Thereafter, after heat treatment (PEB) for accelerating a protective group-eliminating reaction has been conducted, it is developed with an alkaline developer. Although the alkaline developer employed here can be any of a variety of alkaline aqueous solutions that are used in the art, generally, an aqueous solution of tetramethyl ammonium hydroxide or (2-hydroxyethyl)trimethyl ammonium hydroxide (so-called choline) is in many cases employed.

EXAMPLES

Hereinafter, the present invention will be described more concretely with reference to examples, but these should by no means be construed as defining the scope of the present invention. In the examples, "%" and the term "part(s)" used to express the content or the amount of substance used are based on weight unless stated otherwise. Moreover, the weight average molecular weight (Mw) and the degree of polydispersity (Mw/Mn) are values measured by gel permeation chromatography with polystyrene as a standard material.

SYNTHESIS EXAMPLE 1

Production of a Partially 1-ethoxyethylated hydroxystyrene/3-hydroxy-1-adamantyl Methacrylate Copolymer (1) Production of tert-butoxystyrene/3-hydroxy-1-adamantyl methacrylate copolymer 120 g (0.68 mol) of 4-tert-butoxystyrene, 16.74 g (0.08 mol) of 3-hydroxy-1-adamantyl methacrylate, and 273.49 g of 2-propanol were charged to a 500 ml four-neck flask and heated up to 75° C. in an atmosphere of nitrogen. Separately, a solution in which 10.45 g of dimethyl 2,2'-azobis(2-methylpropionate) was dissolved in 27.35 g of 2-propanol, was prepared and added to the above-described monomer solution kept at 75° C. dropwise over 30 minutes. The resulting mixture was kept stirred for 23 hours, further heated, and refluxed for 8 hours. After cooled down to room temperatures, the reaction mixture was added to a mixture constituted of 2,688.2 g of methanol and 1,344.1 g of ion exchange water while stirring the latter. The reaction mixture was kept stirred for 3 hours and then filtrated to provide a white solid. The solid was dried under reduced pressure to give 134.6 g of the copolymer of 4-tert-butoxystyrene and 3-hydroxy-1-adamantyl methacrylate.

(2) Production of hydroxystyrene/3-hydroxy-1-adamantyl methacrylate copolymer 120 g of the copolymer of 4-tert-butoxystyrene and 3-hydroxy-1-adamantyl methacrylate obtained in (1) described above and 360 g of 2-propanol were charged to a 1 liter four-neck flask, dissolved, and heated up to 75° C. To the solution was added a mixed solution of 20.77 g of 36% hydrochloric acid and 20.77 g of 2-propanol dropwise. Thereafter, the resulting solution was refluxed at the same temperature over 3 hours for hydrolysis and then cooled down to room temperatures. This reaction product was added to a mixed solution of 120 g of acetone and 1,200 g of ion exchange water, and a solid precipitated therefrom was collected by filtration. The solid was dissolved in 300 g of acetone, and the resulting solution was added to 3,600 g of ion exchange water. A solid thus precipitated was collected by filtration. The sequence of operations from the dissolution in acetone to the collection of precipitated solid through addition into ion exchange water was repeated two times in total. By drying the solid thus obtained under reduced pressure, 86.7 g of the copolymer of 4-hydroxystyrene and 3-hydroxy-1-adamantyl methacrylate was obtained, in which the tert-butoxy group in the former copolymer had been converted to a hydroxyl group through hydrolysis. The weight average molecular weight of this copolymer is 9,800 and its degree of polydispersity was 2.19. Moreover, examination by $^{13}$C-NMR revealed that the molar ratio of the 4-hydroxystyrene polymerization unit to the 3-hydroxy-1-adamantyl methacrylate polymerization unit was 90.1:9.9.

(3) Partial 1-ethoxyethylation of hydroxystyrene/3-hydroxy-1-adamantyl methacrylate copolymer 35 g of the copolymer of 4-hydroxystyrene and 3-hydroxy-1-admantyl methacrylate obtained in (2) above (constituted of 0.24 mol of 4-hydroxystyrene unit and 0.03 mol of 3-hydroxy-1-adamantyl-methacrylate unit) and 720 g of propylene glycol monomethyl ether acetate were charged to a 1 liter eggplant-shape flask and dissolved. For azeotropic dehydration, the resulting solution was distilled under reduced pressure under conditions of a temperature of 60° C. and a pressure of not higher than 10 Torr until its quantity after distillation became 249.03 g. Secondly, this solution was transferred to a 500 ml four-neck flask which had been nitrogen gas-exchanged. After 4 mg (0.02 mmol) of p-toluenesulfonic monohydrate had been added thereto, 8.18 g (0.11 mol) of ethyl vinyl ether was added dropwise, and the resulting mixture was reacted at 25° C. for 3 hours. 60 ml of ion exchange water was added to this reaction solution and stirred. After allowed to stand still, its organic layer part was taken out. Further, after the sequence of stirring following the addition of 60 ml of ion exchange water and liquid separation had been repeated five times, the organic layer was distilled under reduced pressure and subjected to azeotropy with propylene glycol monomethyl ether acetate for dehydration. The solid concentration of the resin solution thus obtained was 29.7%. Moreover, having analyzed the resin by $^1$H-NMR, a clear peak corresponding to 1-ethoxyethoxy group was observed. and the proportion of the number of 1-ethoxyethoxy groups relative to the number of benzene rings was 40.8%. Accordingly, this resin is one in which the hydroxyl group of the copolymer of 4-hydroxystyrene and 3-hydroxy-1-adamantyl methacrylate has been partially 1-ethoxyethyl etherified. This resin will be referred to as Resin A.

SYNTHESIS EXAMPLE 2

Production of Another Partially 1-ethoxyethylated hydroxystyrene/3-hydroxy-1-adamantyl Methacrylate Copolymer Except that the quantity of the solution constituted of propylene glycol monomethyl ether acetate and the copolymer of 4-hydroxystyrene and 3-hydroxy-1-adamantyl methacrylate dissolved therein after distillation under reduced pressure was adjusted so as to be 178.63 g, and that the amount of charge of ethyl vinyl ether was 4.27 g (0.06 mol), the procedure of (3) of Synthesis Example 1 was repeated. The solid concentration of the resin solution thus obtained was 21.5%, and the analysis of this resin by $^1$H-NMR revealed that the percentage of the number of 1-ethoxyethoxy groups relative to the number of benzene rings was 15.0%. This resin will be referred to as Resin B.

SYNTHESIS EXAMPLE 3

Production of Partially 1-ethoxyethylated Polyhydroxystyrene 40 g (333 mmol on p-hydroxystyrene unit basis) poly(p-hydroxystyrene) (tradename "VP-15000") manufactured by Nippon Soda Co., Ltd. and 47 mg (0.25 mmol) of p-toluenesulfonic monohydrate were charged to a 1 liter eggplant-shape flask and dissolved in 720 g of propylene glycol monomethyl ether acetate. This solution was distilled under reduced pressure under conditions of a temperature of 60° C. and a pressure of not higher than 10 Torr for azeotropic dehydration. The quantity of the solution after distillation was 337 g. This solution was transferred to a 500 ml four-neck flask which had been nitrogen gas-exchanged. 12.0 g (166 mmol) of ethyl vinyl ether was added thereto dropwise, and the resulting solution was reacted at 25° C. for 5 hours. To this reaction solution were added 62.3 g of propylene glycol monomethyl ether acetate and 320 g of methyl isobutyl ketone, and 240 ml of ion exchange water was further added and stirred. Thereafter, the resulting solution was allowed to stand still and its organic layer part was taken out. 240 ml of ion exchange water was added to this organic layer again. The reaction solution was left to stand still after stirring and then washed through liquid separation. After the washing and separation with ion exchange water had been carried out one more time, the organic layer separated from the solution was subjected to distillation under reduced pressure, whereby water and methyl isobutyl ketone were removed therefrom through azeotropy with propylene glycol monomethyl ether acetate, providing a propylene glycol monomethyl ether acetate solution. The liquid thus obtained is a solution of a resin in which the hydroxyl group of poly(p-hydroxystyrene) has been partially 1-ethoxyethyl etherified. Analysis of this resin by $^1$H-NMR revealed that 40% of the hydroxyl groups have been 1-ethoxyethyl etherified. This resin will be referred to as Resin C.

EXAMPLE AND COMPARATIVE EXAMPLE

In Example 1, Resin A was used. A mixed resin of Resin A and Resin B in a ratio of, on a solid basis, 1:1 was employed in Example 2. In Comparative Example C, Resin C was used. Each of these resins was mixed with an acid generating agent, a quencher, and a solvent according to the blending recipe shown below and dissolved. Further, the resulting mixture was filtrated with a filter made of fluororesin having a pore size of 0.2 μm to prepare a resist solution.

Resin (solid content) 10 parts

Acid generating agent: bis(cyclohexylsulfonyl) diazomethane 0.4 part

["DAM-301" manufactured by Midori Kagaku Co., Ltd.]

Quencher: dicyclohexylmethylamine 0.015 part

Solvent: propylene glycol monomethyl ether acetate 50 parts

The quantity of the solvent includes the brought-in portion from the resin solution.

Each of the resist solutions prepared above was applied onto a silicone wafer treated with hexamethyldisilazane (HMDS) by spin coating and then prebaked on a direct hot plate at a temperature of 90° C. for 60 seconds to form a resist film having a thickness of 0.72 μm. Using a KrF excimer stepper ["NSR 2205EX12B" NA=0.55 manufactured by Nikon Corp.], the wafers thus provided with a resist film were exposed to light through masks varied in shape and size. Thereafter, on a hot plate, PEB was carried out at a temperature of 100° C. for 60 seconds. Further, paddle development was conducted using a 2.38% tetramethyl ammonium hydroxide aqueous solution. The developed patterns were observed using a scanning electron microscope to examine their sensitivity, exposure latitude, and resolution each in such a manner as described below. The results are shown in Table 1.

Film penetration sensitivity: Expressed in terms of minimum exposure dose required to penetrate an open field region of 1 square mm and designated by Eth.

Effective sensitivity: Expressed in terms of minimum exposure dose required to provide a 0.25 μm line-and-space pattern of 1:1 and designated by Eo.

Exposure latitude: Expressed by the value Eo/Eth. The larger the value is, the broader the range between an exposure dose with which a resist is penetrated and the standard exposure dose becomes, inhibiting from resolution failure of a resist. Even if the exposure dose is varied somewhat widely, the size of patterns will be practically constant, indicating its excellent exposure latitude.

Resolution: Expressed in terms of the minimum dimension of a pattern of lines and spaces resolved with an exposure dose of effective sensitivity.

TABLE 1

| Example No. | Resin | Sensitivity (mJ/cm2) Eth | Eo | Exposure latitude Eo/Eth | Resolution (μm) |
|---|---|---|---|---|---|
| Example 1 | A | 15 | 41 | 2.7 | 0.16 |
| Example 2 | A/B = 1/1 (Weight ratio) | 14 | 29 | 2.1 | 0.20 |
| Comparative example | C | 15 | 29 | 1.9 | 0.22 |

According to the present invention, aresist composition produced using a poly(hydroxystyrene/3-hydroxy-1-adamantyl methacrylate) resin is improved in exposure latitude and resolution. Moreover, such properties as sensitivity, heat resistance, the ratio of residual thickness, coatability, and dry etching resistance are also maintained good. Thus, through the use of this composition, a fine resist pattern can be formed with high precision.

What is claimed is:

1. A chemical amplification type positive resist composition comprising: a resin which has a hydroxystyrene-based polymerization unit, a 3-hydroxy-1-adamantyl methacrylate-based polymerization unit and a polymerization unit having a group unstable toward an acid, and, though insoluble or hardly soluble in an alkali in itself, becomes alkali-soluble after the acid-unstable group has been cleaved by the action of an acid; and an acid generating agent.

2. The composition according to claim 1, wherein the polymerization unit having a group unstable toward an acid is represented by the formula (V):

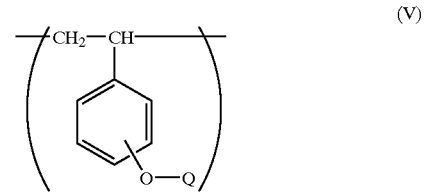

wherein Q represents a group unstable toward an acid.

3. The composition according to claim 2, wherein the group Q which is unstable toward an acid is tert-butyl, tert-butoxycarbonyl, or a group represented by the formula (III):

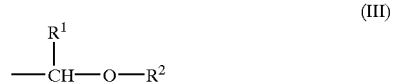

wherein $R^1$ represents an alkyl group having 1 to 4 carbon atoms, $R^2$ represents an alkyl group having 1 to 6 carbon atoms or a cycloalkyl group having 5 to 7 carbon atoms, or $R^1$ and $R^2$ together form a trimethylene or tetramethylene chain.

4. The composition according to claim 3, wherein the group Q which is unstable toward an acid is represented by the formula (III), wherein $R^1$ is an alkyl group having 1 to 4 carbon atoms, and $R^2$ is an alkyl group having 1 to 6 carbon atoms or a cycloalkyl group having 5 to 7 carbon atoms.

5. The composition according to any of the claims 1 to 4, wherein the hydroxystyrene-based polymerization units and the 3-hydroxy-1-adamantyl methacrylate-based polymerization units account for, in total, 50 mol % or more of the whole resin.

6. The composition according to any of the claims 1 to 5, wherein the hydroxystyrene-based polymerization units and the 3-hydroxy-1-adamantyl mathacrylate-based polymerization units are present in a molar ratio within the range of from 99:1 to 80:20.

7. The composition according to any of the claims 1 to 6, which comprises, based on the total solid content in the composition, 80 to 99.8% by weight of the resin and 0.1 to 20% by weight of the acid generating agent.

8. The composition according to any of the claims 1 to 7, which further comprises anitrogen-containing basic organic compound as a quencher.

* * * * *